United States Patent
Halamik et al.

(10) Patent No.: US 6,943,069 B2
(45) Date of Patent: Sep. 13, 2005

(54) POWER SYSTEM INHIBIT METHOD AND DEVICE AND STRUCTURE THEREFOR

(75) Inventors: Josef Halamik, Roznov (CH); Jefferson W. Hall, Chandler, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 99 days.

(21) Appl. No.: 10/685,091

(22) Filed: Oct. 14, 2003

(65) Prior Publication Data

US 2005/0077551 A1 Apr. 14, 2005

(51) Int. Cl.⁷ .............................................. H01L 21/00
(52) U.S. Cl. .................... 438/186; 438/195; 438/275
(58) Field of Search ................. 438/186–196, 438/275

(56) References Cited

U.S. PATENT DOCUMENTS

| 5,477,175 A | 12/1995 | Tisinger et al. |
| 6,020,227 A | * 2/2000 | Bulucea ...................... 438/194 |

\* cited by examiner

*Primary Examiner*—Richard A. Booth
(74) *Attorney, Agent, or Firm*—Robert F. Hightower (57) ABSTRACT

A power control system (25) uses two separate currents to control a startup operation of the power control system (25). The two currents are shunted to ground to inhibit operation of the power control system (25) and one of the two currents is disabled to minimize power dissipation. The two independently controlled currents are generated by a multiple output current high voltage device (12) responsively to two separate control signals (23, 24).

7 Claims, 6 Drawing Sheets

POWER SYSTEM INHIBIT METHOD AND DEVICE AND STRUCTURE THEREFOR

BACKGROUND OF THE INVENTION

The present invention relates, in general, to electronics, and more particularly, to methods of forming semiconductor devices and structure.

In the past, the electronics industry utilized various methods and devices to control high value or large input voltages in order to provide controlled output voltages and currents. One example of such a device, referred to as an off-line bootstrap startup circuit, was disclosed in U.S. Pat. No. 5,477,175 issued to Tisinger et al on Dec. 19, 1995 and which is hereby incorporated herein by reference. The bootstrap startup circuit received a large input voltage and produced an output current that charged a capacitor and generated an output voltage. However, many applications required a sequence of currents that could be controlled to charge the capacitor and form the output voltage. However, using multiple bootstrap startup circuits increased the manufacturing cost and complexity of the resulting semiconductor products and of applications using the products.

Accordingly, it is desirable to have a startup circuit that can receive an input voltage having a high voltage value and produce a sequence of currents from the input voltage.

For simplicity and clarity of illustration, elements in the figures are not necessarily to scale, and the same reference numbers in different figures denote the same elements. Additionally, descriptions and details of well known steps and elements are omitted for simplicity of the description. As used herein current carrying electrode means an element of a device that carries current through the device such as a source or a drain of an MOS transistor or an emitter or a collector of a bipolar transistor, and a control electrode means an element of the device that controls current through the device such as a gate of an MOS transistor or a base of a bipolar transistor.

DETAILED DESCRIPTION OF THE DRAWINGS

Figure 1:
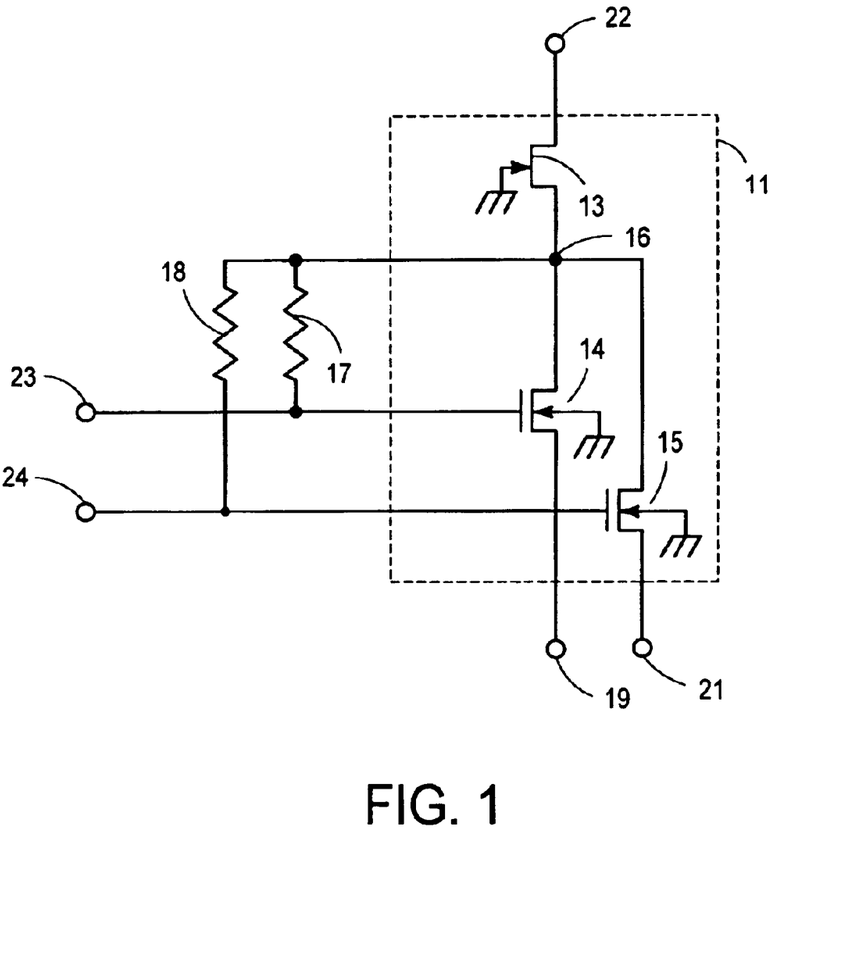
FIG. 1 schematically illustrates an embodiment of a portion of a high voltage multiple output current device in accordance with the present invention.

FIG. 1 schematically illustrates an embodiment of a portion of a high voltage multiple output current device 12 that can generate multiple independently controlled output currents from a single high voltage input. Device 12 includes a high voltage multiple output element 11 that preferably is formed to include a JFET transistor 13, a first MOS transistor 14, and a second MOS transistor 15. Device 12 also includes a first bias resistor 17 and a second bias resistor 18 that are formed to provide bias currents to the gates of transistors 14 and 15, respectively. Device 12 is formed to receive a high voltage on a high voltage input 22 and generate a first output current and a second output current on outputs 19 and 21, respectively, in response to control signals applied to control inputs 23 and 24, respectively.

In order to provide this functionality, a drain of transistor 13 is connected to input 22 and a source is connected to a common node 16. A drain of transistors 14 and 15 is connected to the source of transistor 13 and to node 16. A gate of transistor 14 is connected to input 23 and to a first terminal of resistor 17, and a source is connected to output 19. Transistor 15 has a gate connected to input 24 and to a first terminal of resistor 18, and a source connected to output 21. A second terminal of both resistors 17 and 18 is connected to the source of transistor 13 and to the drains of transistors 14 and 15. The gate connection of transistor 13 will be explained in more detail in the description of FIG. 3. In the preferred embodiment, transistors 14 and 15 are both N-channel MOS transistors and transistor 13 is an N-channel J-FET transistor. In other embodiments, transistors 14 and 15 may be other transistors structures such as J-FETs and bipolar transistors.

When voltage is applied to input 22, outputs 19 and 21 are controlled by the voltages applied to control inputs 23 and 24. Transistors 14 and 15 are independently enabled and disabled, thus, each respective output 19 and 21 has independently controlled output currents. If no external voltage is applied to either input 23 or 24, for example input 23 or 24 is floating, respective resistor 17 or 18 supplies a bias current from transistor 13 to enable device 12 and the respective transistor to generate an output current at respective output 19 or 21. In an operational circuit, a control voltage typically is applied to inputs 23 and 24 to control the value of the output current. When the voltage applied to input 23 or 24 produces a gate-to-source voltage that is less than the threshold voltage of the respective transistor, that transistor typically is disabled. Even when either of transistors 14 or 15 is disabled, current still flows through respective resistor 17 or 18, thus, resistors 17 and 18 are designed to ensure that the bias current is very small in order to minimize the power dissipation of device 12. Disabling both transistors 14 and 15 disables device 12. When the voltage applied to input 23 produces a gate-to-source voltage that is greater than the threshold voltage of transistor 14, transistor 14 is enabled and current flows through transistors 13 and 14 to output 19. Similarly, when the voltage applied to input 24 is greater than the threshold voltage of transistor 15, transistors 13 and 15 are enabled and current flows through transistors 13 and 15 to output 21. As will be seen hereinafter, the novel construction of device 12 and element 11 facilitates generating these two different and independently controlled output currents from one device. The maximum value of the output currents supplied by device 12 is selected by adjusting the width of the channel of transistors 14 and 15.

The breakdown voltages for transistors 13, 14, and 15 depend on the application and various other factors. In one embodiment for world wide line voltage applications, the breakdown voltage at the drain of transistor 13 with respect to substrate 76 may exceed four hundred volts (400 V) and the sustainable voltage at the source of transistors 14 and 15 may exceed fifty volts (50 V).

Figure 2:
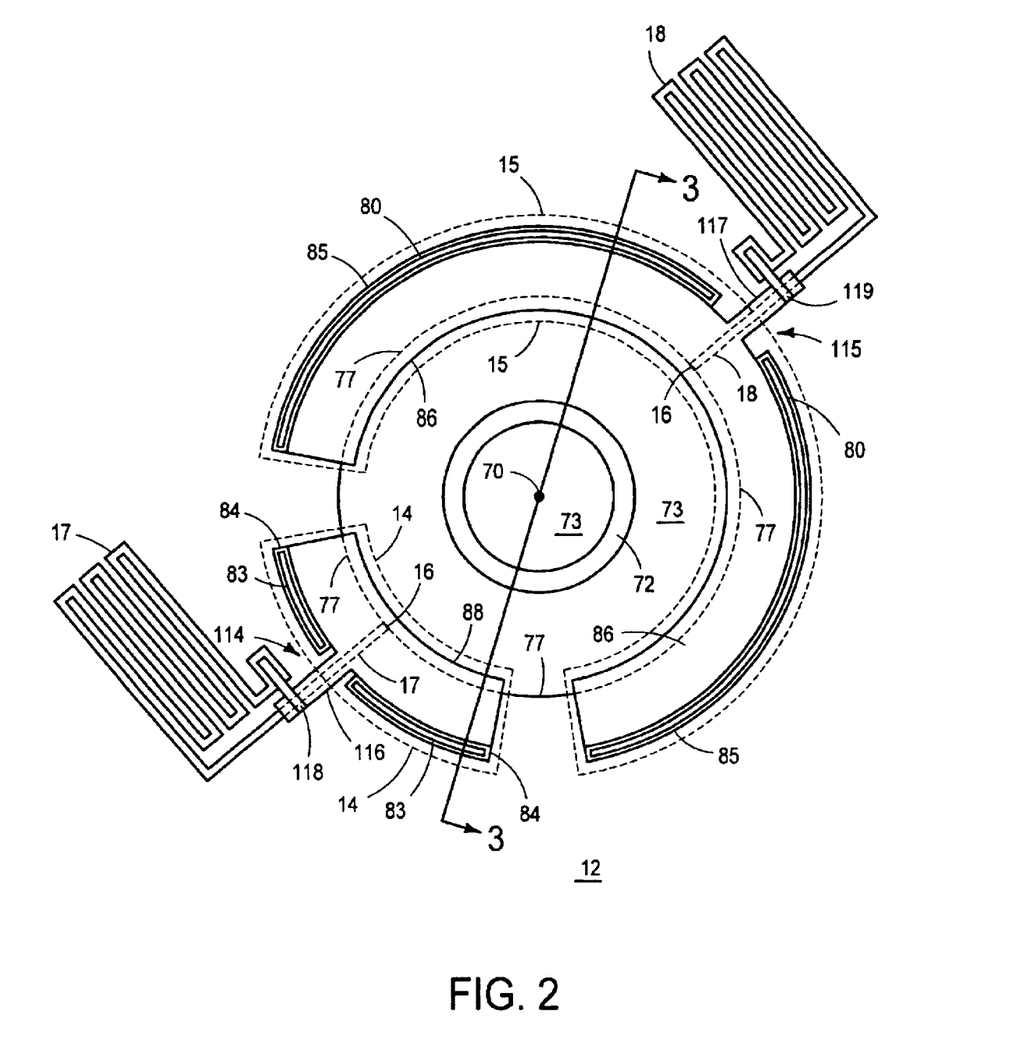
FIG. 2 illustrates an enlarged plan view of a portion of an embodiment of the high voltage multiple output current device of FIG. 1 in accordance with the present invention.
Figure 3:
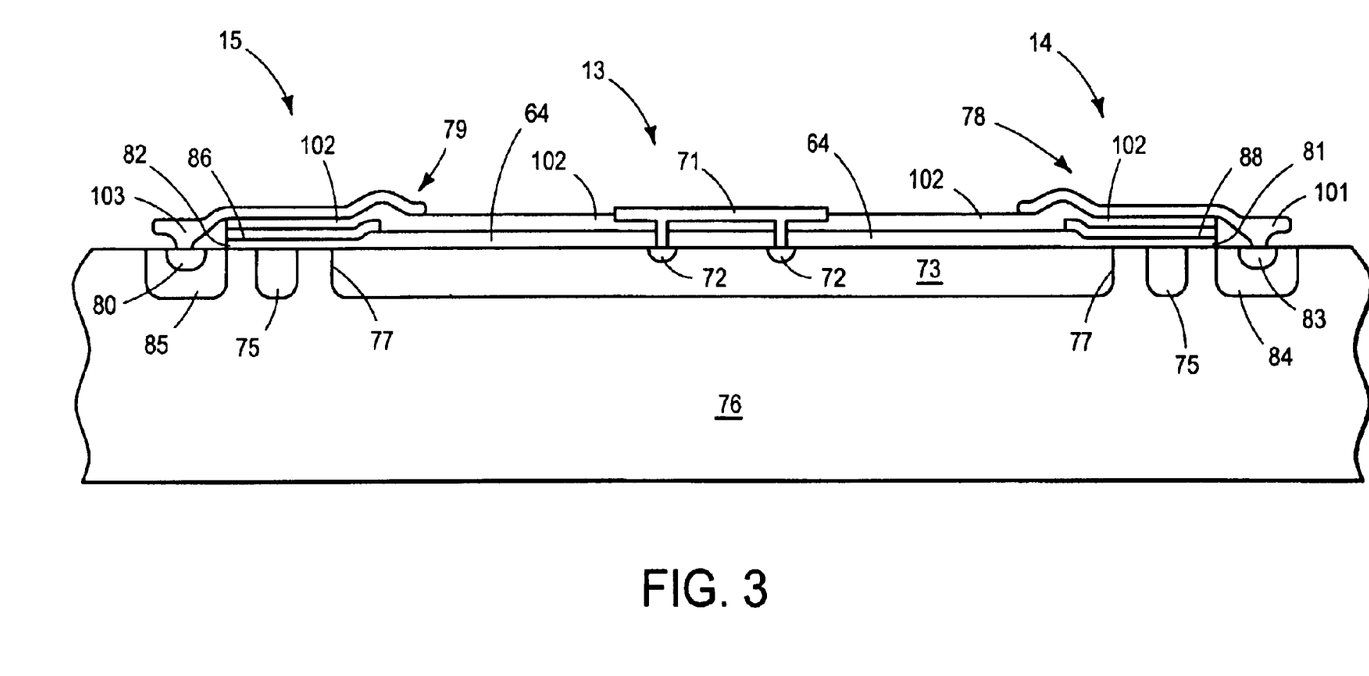
FIG. 3 illustrates an enlarged cross-sectional view of a portion of the high voltage multiple output current device of FIG. 2 in accordance with the present invention.

FIG. 2 illustrates an enlarged plan view of a portion of an embodiment of device 12 explained in the description of FIG. 1. FIG. 3 illustrates an enlarged cross-sectional view of device 12 illustrated in FIG. 2 along section line 3-3. This description has references to both FIG. 2 and FIG. 3. Transistors 14 and 15 are identified in general by dashed lines in FIG. 2. Transistors 13, 14, and 15 are formed as closed geometric shapes on a surface of a semiconductor substrate 76. Typically the closed geometric shapes have centers that are concentric and have some overlapping periphery. In the preferred embodiment, the closed geometric shapes are formed as circles or arcs of circles having various concentric radii. For clarity of the explanation, the preferred embodiment is explained, however, those skilled in the art will realize that other closed shapes such as ellipses, squares, pentagons, hexagons, etc. may also be used instead of circles and that transistors 13, 14, and 15 may have different lengths and widths.

In the preferred embodiment, the closed geometric shapes of transistor 13 are formed as concentric circles that have increasing radii. A first portion of the geometric shapes of transistors 14 and 15 are formed as a circle and a second portion are formed as arcs of a circle with the arcs having radii that are larger than radii of the circle portion of transistors 13, 14, and 15. Transistor 13 is formed to include a drain contact 72 and a drain electrode 71 that overlies contact 72. Transistor 14 also includes a pair of doped regions shaped as arcs of a circle that form a pair of source regions 84 and a gate polysilicon 88 shaped as an arc of a circle. Transistor 15 includes a pair of doped regions shaped as arcs of a circle that form a pair of source regions 85 and a gate polysilicon 86 shaped as an arc of a circle.

In the preferred embodiment, drain contact 72 of transistor 13 is formed as a doped region on the surface of substrate 76. Contact 72 is shaped as a hollow first circle having a first radius and a center 70. A circular shaped doped region 73 is formed on the surface of substrate 76 concentric with contact 72 and with a second radius that is larger than the radius of contact 72. Because of the hollow circle shape of contact 72, a first circular shaped inner portion of region 73 underlies contact 72 (see FIG. 3). A second circular portion of region 73 extends from the outer circumference of contact 72 to an inner edge of polysilicon 88 and 86, and forms the channel of transistor 13. The interface of substrate 76 with the portion of region 73 underlying contact 72 and the second portion of region 73 functions as the gate of J-FET transistor 13. Typically substrate 76, and thus the gate of transistor 13, is connected to the lowest potential in the circuit that uses device 12. The arc of region 73 underlying the inner arc of polysilicon 88 and 86 forms the source of transistor 13 and the drain of each of transistors 14 and 15, respectively. This third circular shaped region extends radially to an outer edge 77 of region 73. Thus the drain and source of transistor 13 are formed as closed geometric shapes with the source having a radius that is larger than the drain. Also, one doped region is used to form the source and drain of transistor 13 and the drain of transistors 14 and 15.

Source regions 84 of transistor 14 are formed as two doped areas each shaped as an arc of a circle having a larger radius then the radius of the drain of transistor 14. Typically, an inner portion of source region 84 underlies polysilicon 88. Source contact 83 is formed within source region 84. The two doped areas of source regions 84 are spaced apart by an opening 114 that is formed along the outer periphery of polysilicon 88. A portion of polysilicon 88 extends through opening 114 and forms a tab 116 that facilitates making contact to polysilicon 88. Resistor 17 is formed as a doped region on the surface of substrate 76. One end of resistor 17 extends under tab 116, illustrated by dashed lines, to make electrical contact to region 73 at node 16. A second end of resistor 17 is connected to tab 116 by a metal connection 118. Similarly, source regions 85 of transistor 15 are formed as two doped areas each shaped as an arc having a radius larger than the radius of the drain of transistor 15. Typically, an inner portion of source region 85 underlies polysilicon 86. Source contact 80 is formed within source region 85. The two doped areas of source regions 85 are spaced apart by an opening 115 that is formed along the outer periphery of polysilicon 86. A portion of polysilicon 86 extends through opening 115 and forms a tab 117 that facilitates making contact to polysilicon 86. Resistor 18 is formed as a doped region on the surface of substrate 76. One end of resistor 18 extends under tab 117, illustrated by dashed lines, to make electrical contact to region 73 at node 16. A second end of resistor 18 is connected to tab 117 by a metal connection 119. Using two doped regions for the source of each of transistors 14 and 15 facilitates connecting to the gate electrode of each transistor and forming resistors 17 and 18.

As can be seen from the explanation of FIGS. 2 and 3, an internal periphery of the circle portion of transistors 14 and 15 formed by region 73 merges into the external periphery of transistor 13 to form a source of transistor 13 that merges into the drain of transistors 14 and 15. The outer periphery of region 73 has a curved contour and the inner periphery of regions 84 and 85 have a shape that is the same as the shape of the periphery of region 73. Additionally, gate structures 78 and 79 have a contour that is the same as the shape of the outer periphery of region 73. Using the same contour facilities forming a well controlled channel for transistors 14 and 15.

In the preferred embodiment, drain electrode 71 is formed as a closed circle on an insulator 64, such as a field oxide and on an interlayer dielectric 102. Since drain contact 72 has the hollow circle configuration, a portion of electrode 71 overlying contact 72 extends through insulator 64 and dielectric 102 to contact 72. Electrode 71 is also formed to function as a bonding pad to make contact to device 12. The open section in the center portion of contact 72 facilitates bonding to electrode 71 without damaging device 12. In other embodiments, contact 72 can be formed as a closed circle within region 73.

Referring to FIG. 3, transistors 13, 14, and 15 are formed on the surface of substrate 76. A portion of the surface of substrate 76 is doped in order to form circular shape region 73. A portion of region 73 is more heavily doped in order to form concentric hollow circular shaped drain contact 72 within region 73. Source region 85 and source region 84 are formed as doped regions on the surface of substrate 76 and spaced apart from the circumference of region 73. Source contacts 83 and 80 are formed in respective source regions 84 and 85.

A body region 75 of transistor 14 is formed as a doped region on the surface of substrate 76 underlying polysilicon 88. A portion of region 75 extends through opening 114 (FIG. 2) to facilitate forming contact to region 75. Similarly, a body region 74 of transistor 15 is formed as a doped region on the surface of substrate 76 underlying polysilicon 86. For clarity of the drawings, the extension through openings 114 and 115 is not shown. A portion of region 74 extends through opening 115 (FIG. 2) to facilitate forming contact to region 74. A gate structure 78 is formed on substrate 76 interposed between source region 84 and region 73 and a gate structure 79 is formed on substrate 76 interposed between source region 85 and region 73. Gate structure 78 includes a gate insulator 81 formed on substrate 76, gate polysilicon 88 formed on insulator 81 and dielectric 102 formed on polysilicon 88. Similarly, gate structure 79 includes a gate insulator 82 formed on substrate 76, gate polysilicon 86 formed on insulator 81, dielectric 102 formed on polysilicon 86, and gate electrode 87 formed on dielectric 102. Typically, one edge of structure 78 overlies a portion of source region 84 and another edge overlies a portion of region 73. Similarly, one edge of structure 79 overlies a portion of source region 85 and another edge overlies a portion of region 73. Preferably substrate 76 is a P-type material, and region 73, source region 85, and source region 84, are N-type material resulting in transistor 13 being formed as an N-channel mode J-FET transistor and transistors 14 and 15 being formed as N-channel MOS transistors.

Those skilled in the art will realize that the closed geometry of the circular shapes of device 12 may also be formed with region 73 formed as an ellipse and regions 84 and 85 formed as arcs, a square with regions 84 and 85 formed as a rectangle along each side of the square, a pentagon with regions 84 and 85 formed as a rectangle along some sides of the pentagon, a hexagon with regions 84 and 85 formed as a rectangle along some sides of the hexagon, etc.

Figure 4:
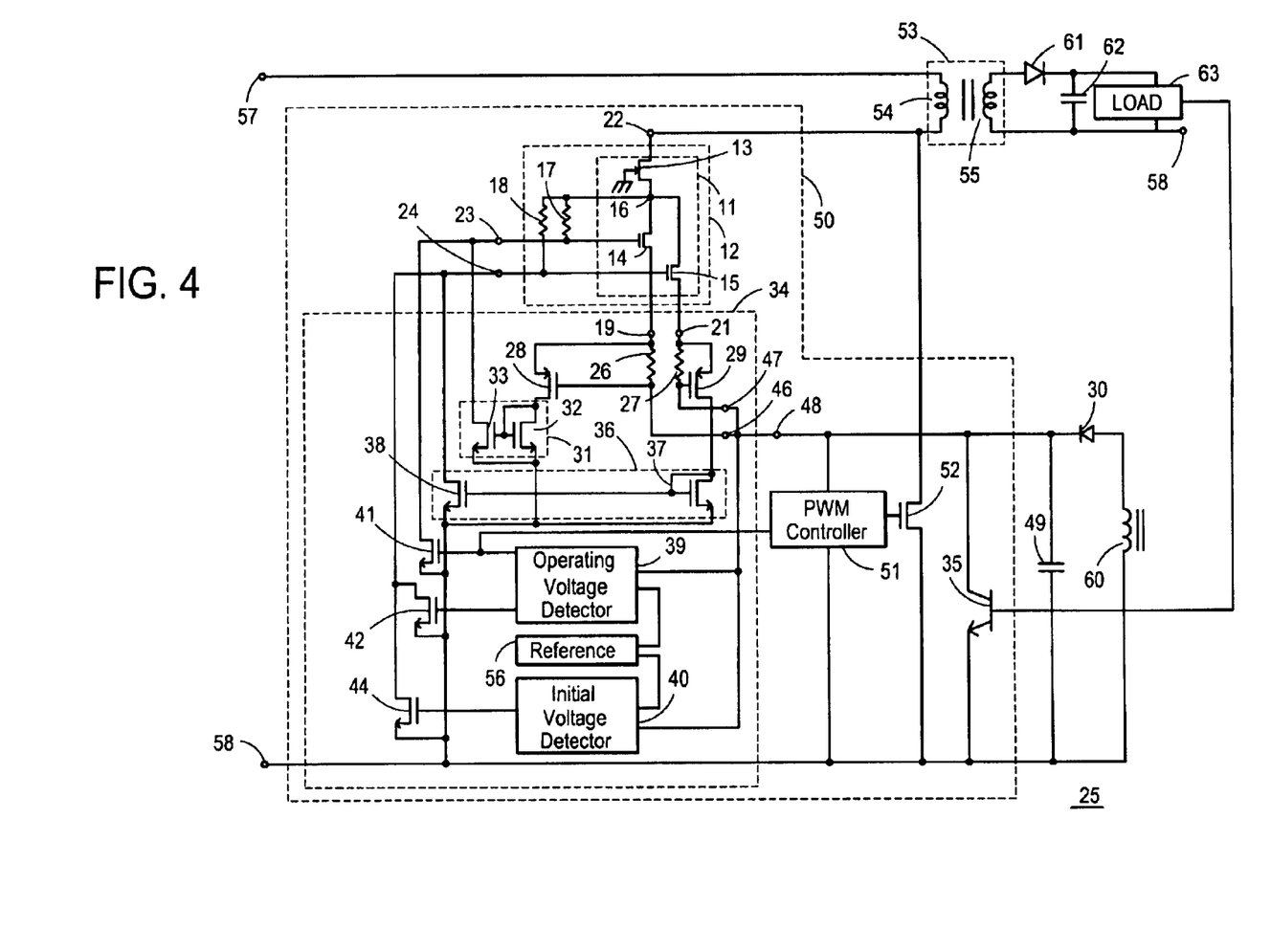
FIG. 4 schematically illustrates an embodiment of a portion of a power control circuit that utilizes the high voltage multiple output current device of FIG. 2 in accordance with the present invention.

FIG. 4 schematically illustrates an embodiment of a portion of a power control system 25 that uses device 12. Power control system 25 uses device 12 and a startup control circuit 34 for controlling a high voltage power-up sequence of system 25 and for inhibiting the operation of system 25. System 25 receives an input voltage between a voltage input 57 and a voltage return 58. Other components typically are externally connected to circuit 34 in order to provide the desired functions of system 25. For example, an energy storage capacitor 49, a transformer 53 having a primary inductance 54, a secondary inductance 55 and an auxiliary inductance 60, a rectifying diode 61, another storage capacitor 62, a pulse width modulator (PWM) controller 51, a power transistor 52, an inhibit transistor 35, and a load 63 typically are a part of system 25. Capacitors 49 and 62, transformer 53, controller 51, transistor 52, and diodes 61 and 30 are shown merely to assist in describing the operation of device 12 and circuit 34. Those skilled in the art understand that other well known components and functions that are not shown in FIG. 4 typically are included to form a complete power control system. In most embodiments, capacitors 49 and 62, transformer 53, controller 51, transistor 35, and diodes 61 and 30 are external to the semiconductor die on which device 12 and circuit 34 are formed. In some embodiments, controller 51 or transistor 52 may be another portion of the semiconductor die on which device 12 and circuit 34 are formed or may be external. In the preferred embodiment, transistor 14 has a narrower channel width than transistor 15 and provides a smaller output current on output 19 than transistor 15 provides on output 21. In this preferred embodiment, transistor 15 is formed to have a width of approximately six hundred (600) microns and transistor 14 is formed to have a width of approximately one hundred (100) microns. Those skilled in the art will realize that transistors 14 and 15 can be formed to have approximately equal widths or various other widths depending on the required current density and transistor design rules.

Device 12 and circuit 34 are utilized to provide an initial voltage that is used to power circuits within system 25 so that system 25 may provide a smooth controlled startup of the initial voltage sequence that is applied to other circuits connected to system 25, such as controller 51. Circuit 34 has a first output 46 and a second output 47 that provide two controlled currents that are essentially equal to the first output current from output 19 and the second output current from output 21 of device 12. In the preferred embodiment, outputs 46 and 47 are connected together to form an output 48 and an associated controlled output current of circuit 34. In other embodiments, outputs 46 and 47 may be separated and used to provide current to different circuit functions. In order to control the output currents of device 12, circuit 34 has a first current control loop that includes a first sense resistor 26, a first sense transistor 28, and a first current mirror 31 that includes a first reference transistor 32 and a first mirror transistor 33. A second current control loop of circuit 34 includes a second sense resistor 27, a second sense transistor 29, and a second current mirror 36 that includes a second reference transistor 37 and a second mirror transistor 38. The first output current generated at output 19 is controlled by the first control loop. The current at output 19 flows through resistor 26 and generates a corresponding voltage drop across resistor 26. Resistor 26 is connected between the gate and source of transistor 28 and forms the gate-to-source voltage of transistor 28, thus, the voltage drop across resistor 26 establishes a first sense current flow through transistor 28. Current mirror 31 receives the first sense current from transistor 28 and responsively controls the voltage applied to control input 23 thereby controlling the gate voltage of transistor 14 and the value of the first output current. As the output current on output 19 increases, the first sense current correspondingly increases and responsively lowers the gate voltage of transistor 28 and correspondingly the control voltage on input 23 to reduce the output current value. This negative feedback loop, therefore, acts to regulate the current in transistor 14. Similarly the second control loop includes a second bias resistor 27 coupled to receive the second output current at output 21 and responsively generate a gate-to-source voltage for transistor 29 and responsively generate a second sense current flowing through transistor 29. Transistor 29 is coupled to second current mirror 36 which receives the second sense current from transistor 29 and responsively controls the control voltage applied to second control input 24 thereby controlling the gate voltage of transistor 15 and the value of the second output current. The two current control loops may be omitted in some embodiments.

Circuit 34 also includes an operating voltage detector 39 and an initial voltage detector 40 that are utilized to sequence the operation of device 12. During the startup period, detectors 39 and 40 control the operation of transistors 14 and 15 based on the value of the voltage formed at output 48. In some embodiments, outputs 46 and 47 may be separated and used to provide current to different circuit functions, thus, detectors 39 and 40 may be connected to the same or different outputs of circuit 34 or other circuits (see for example FIG. 6). A voltage reference 56 provides two reference voltages on a first and second output of reference 56. The two reference voltages are used by detectors 39 and 40 to set the detection level for detecting the initial voltage value and the desired operating voltage value. Controller 51 has an enable input that is controlled by the output of detector 39 to ensure that controller 51 does not drive primary inductance 54 until the desired operating voltage is reached. Those skilled in the art will realize that the current control loops and detectors 39 and 40 may be implemented by a variety of designs as long as the control loop controls the current, and the detectors control device 12 based on the voltage on outputs 46 and 47.

As the voltage at inputs 57 and 22 begins at zero and increases with respect to time, the output voltage at outputs 46 and 47 begins at zero and increases past an initial voltage value and reaches a desired operating voltage value. The desired operating voltage value typically is selected to be a value that provides normal operation for other circuits external to circuit 34 such as controller 51 and load 63. The initial voltage value typically is much less than the desired operating value and generally is a lower limit of voltage values that can be utilized to operate some basic circuit functions. For example, the initial voltage value may be a value at which some basic comparators or other circuits need to operate prior to the output voltage reaching its desired operating value. The initial voltage value typically is used for operating reference 56 and detectors 39 and 40. In order to provide this initial voltage, output 48 is connected to capacitor 49 and the current from outputs 46 and 47 charges capacitor 49 to form an output voltage of circuit 34 on output 48. Circuit 34 receives this output voltage and responsively controls the sequencing of device 12. The initial voltage value is selected to be as low as possible so capacitor 49 may be charged to the initial value as soon as possible in order to minimize the amount of time required to startup system 25.

Detector 40 is formed to receive the output voltage and responsively disable transistor 15 and enable device 12 to supply current from transistor 14 as long as the output voltage is less than the initial voltage value. When the output voltage is equal to or greater than the initial voltage value, detector 40 also enables transistor 15 so that device 12 can generate both the first and second output currents. Detector 39 is formed to receive the output voltage on output 48 and responsively disable device 12 when the output voltage is equal to or greater than the desired operating voltage value. In the preferred embodiment, detector 39 has hysteresis to prevent detector 39 from switching on and off as the output voltage varies slightly around the desired operating voltage value. Due to the hysteresis input, detector 39 re-enables device 12 when the output voltage decreases to a third value that is approximately equal to the desired operating voltage value minus the hysteresis offset voltage of detector 39. To assist in this function, detector 39 has an input coupled to output 48 and two outputs that are respectively coupled to a first disable transistor 41 and a second disable transistor 42. Each of detectors 39 and 40 and the associated reference may be formed by a variety of circuits that are well known to those skilled in the art including a single MOS transistor that uses the transistor's threshold to establish the reference voltage value.

Figure 5:
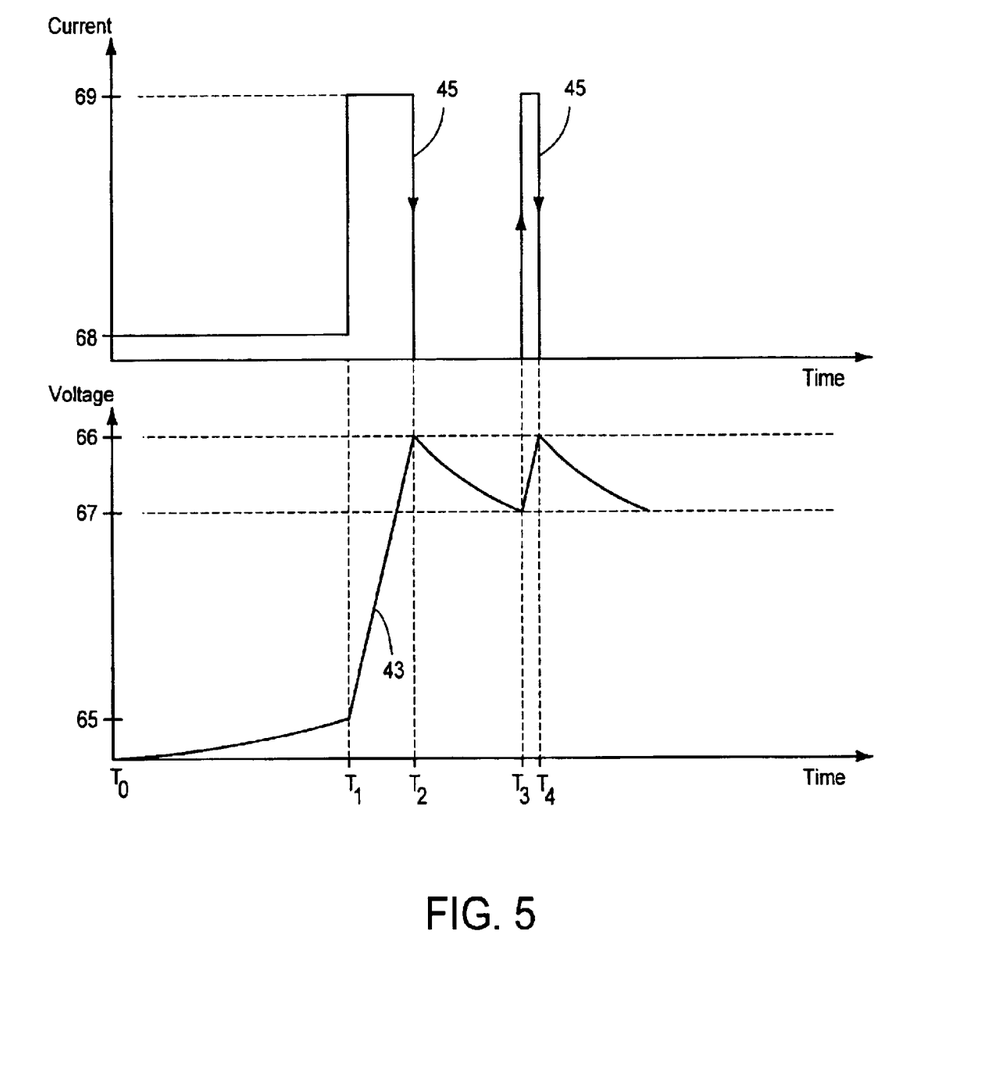
FIG. 5 graphically illustrates some signals of the power control circuit of FIG. 4 in accordance with the present invention.

FIG. 5 is a graph having plots 43 and 45 that illustrate the output voltage and output current, respectively, of circuit 34. This description has references to both FIG. 4 and FIG. 5. Prior to applying power to input 57, capacitors 62 and 49 are discharged and output 48 is at zero volts. Consequently, circuit 34 is not operating and there is no output current from device 12. When an input voltage is applied to input 57 at time T0, current begins to flow through inductance 54 and into input 22 of device 12. As the voltage on input 22 increases, transistor 13 turns-on and supplies a bias current through resistors 17 and 18 to transistors 14 and 15. The output of detector 39 is low and the output of detector 40 is high, thus, transistors 41 and 42 are disabled and transistor 44 is enabled to pull input 24 low and disable transistor 15. Resistor 17 pulls control input 23, thus the gate of transistor 14, to the input voltage at input 22 and enables transistors 14 to supply the first output current to circuit 34. Circuit 34 controls the output current to supply the first control current to output 48 at an output current value 68 (See plot 45). The output current begins charging capacitor 49. At time T1, capacitor 49 has charged to initial voltage value 65 and the output of detector 40 switches to a low value thereby disabling transistor 44 and allowing resistor 18 to enable transistor 15. Circuit 34 receives the second output current and controls the value to provide the second control current to output 48. Circuit 34 also provides a third output to controller 51. Transistor 14 remains enabled, consequently, the controlled output current at output 48 increases to a value 69, and capacitor 49 is now charged by both the first and the second output currents from device 12. When the value of the voltage on output 48 increases to the desired operating voltage value 66 at time T2, the output of detector 39 switches to a high value thereby enabling transistors 41 and 42 to pull control inputs 23 and 24 low and disabling device 12. The high on the output of detector 39 also enables controller 51 and transistor 52 begins to drive input 22 responsively to controller 51. System 25 begins supplying power to load 63. If the output voltage on output 48 decreases to a third voltage value 67, the hysteresis offset of detector 39 detects the low voltage at a time T3 and disables transistors 41 and 42 thereby enabling device 12 to supply the first and second output currents to output 48 and once again charging capacitor 49 to operating voltage value 66. Third voltage value 67 may be any value including a value very near to value 65.

During the operation of system 25, it may be appropriate to disable or inhibit system 25. For example, load 63 may detect a condition that requires disabling system 25. In such a case, load 63 or another circuit (not shown) may enable transistor 35 to pull output 48 low and inhibit the operation of system 25. Pulling output 48 low discharges capacitor 49. When capacitor 49 is discharged to a value less than the initial voltage value, detector 40 enables transistor 44 to disable transistor 15 of device 12. Disabling transistor 15 inhibits system 25 from supplying the second output current and keeps device 12 enabled to supply the first output current. Since the first output current is much smaller than the second output current, preferably at least ten times less, keeping transistor 14 enabled disables controller 51 and prevents system 25 from providing the voltage to load 63, and allows device 12 to supply a the first output current as a standby current. Thus, this method provides an easy method to inhibit the operation of system 25 while maintaining a standby current and provides a method that allows easily recharging capacitor 49 when load 63 disables transistor 35. It is important to minimize the amount of power dissipated while system 25 is inhibited. Because of the low current of the first output current, this method of inhibiting system 25 minimizes the amount of power dissipated from the voltage applied to input 57. Typically the value of the first output current is chosen to be less than the standby current specified in certification criteria such as ENERGY STAR®. It can be seen that device 12 and transistor 35 form an inhibit circuit of system controller 50 and system 25.

Those skilled in the art will understand that transistor 35 may be enabled at any time in the operational sequence and the inhibit function begins at the output voltage and current values existing at that time. Additionally, detectors 39 and 40 could also use other control sequences such as enabling device 12 to supply only the second output current after detecting the initial voltage value, or could reverse the sequence and supply the second output current before detecting the initial voltage value and supply the first output current after detecting the initial voltage value, etc.

Figure 6:
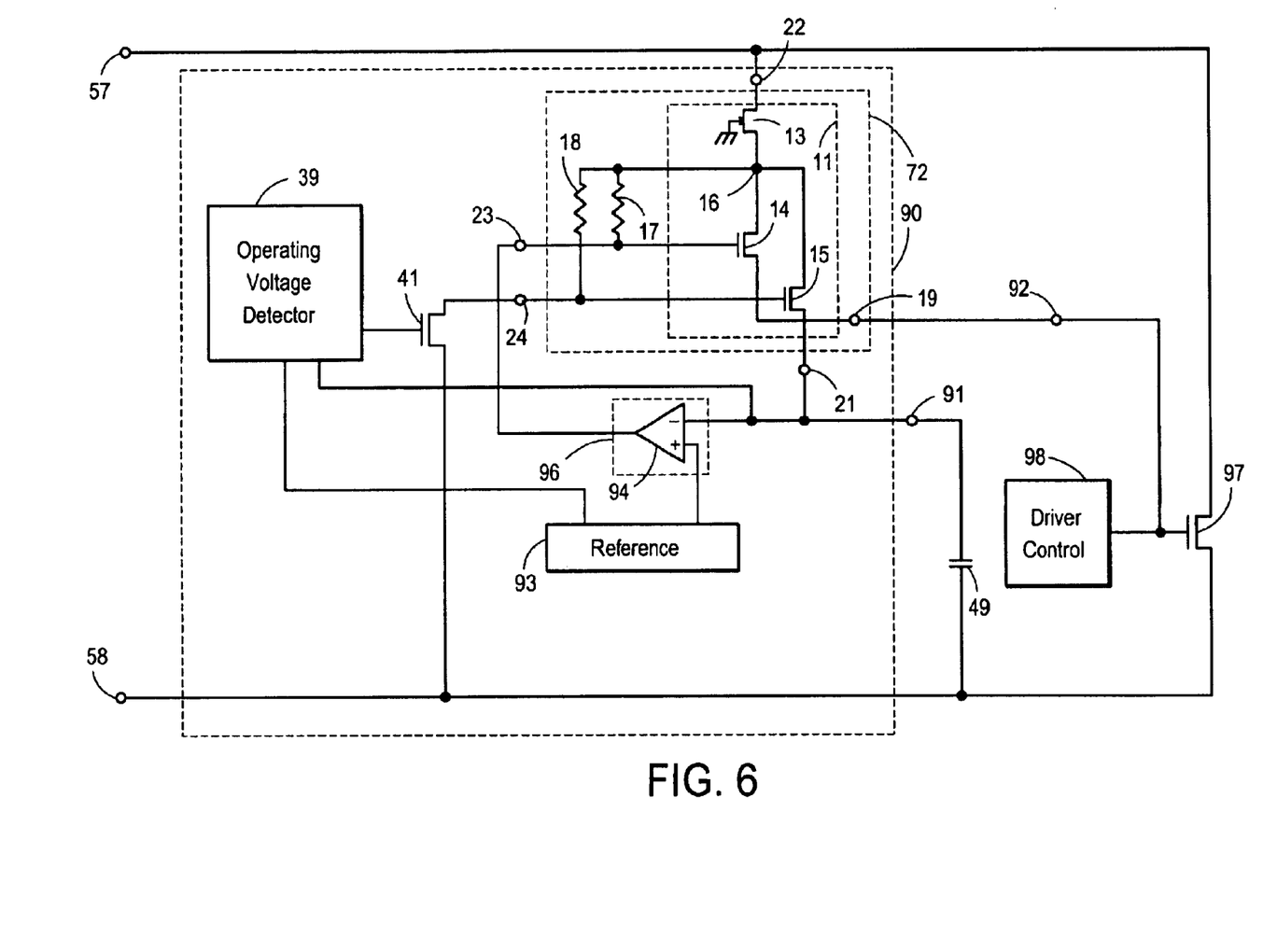
FIG. 6 schematically illustrates an embodiment of a portion of an electro-static discharge (ESD) protection circuit that utilizes the high voltage multiple output current device of FIG. 2 in accordance with the present invention.

FIG. 6 schematically illustrates an embodiment of a portion of an electro-static discharge (ESD) protection circuit 90. Circuit 90 utilizes output 21 of device 12 as a startup current source to provide a controlled startup voltage at output 91 and utilizes output 19 to also enable ESD protection for circuits connected to input 57. Often during the operation of an electrical circuit, the circuit may receive an ESD discharge from an external source. Such an ESD discharge can easily damage semiconductor devices that are connected close to the source of the ESD discharge. Circuit 90 utilizes transistor 14 of device 12 to enable transistor 97 during an ESD event and uses transistor 15 to provide the controlled startup of the output voltage on an output 91 of circuit 90. Thus, transistors 14 and 15 operate independently to implement two different functions that are derived from the output of transistor 13. Detector 39 and transistor 41 are used to control transistor 15 to provide the control startup of the output voltage, and an ESD detector 96 is used to disable transistor 14 unless an ESD event occurs. Circuit 90 also includes a reference 93 that provides a first reference voltage that is used for detecting the desired operating voltage value on output 91 and provides a second reference voltage that is used for disabling transistor 14.

Operating voltage detector 39 controls transistor 15 to charge capacitor 49 until the voltage on output 91 reaches the desired operating voltage value. When the input voltage applied to input 22 is initially applied to circuit 90, capacitor 49 is discharged. The input voltage increases sufficiently to turn-on transistor 13 and supply bias currents through resistor 18 to transistor 15. The output of detector 39 starts at a low voltage value and remains low until the output voltage on output 91 reaches the desired operating voltage value. The low voltage disables transistor 41 which allows resistor 18 to enable transistor 15 to form an output current to charge capacitor 49 and form the output voltage. When capacitor 49 is charged to the desired operating voltage value, the output of detector 39 goes high enabling transistor 41 and disabling transistor 15 of device 12. The hysteresis of detector 39 functions to keep the output voltage at the desired operating voltage value as explained in the description of FIG. 4. Detector 39 has no effect on transistor 14.

When an ESD event occurs, the ESD charges the gate of transistor 14 thereby enabling transistor 14. Transistor 14 is formed to provide a drive current that is sufficient to drive transistor 97 into a low impedance state. Transistor 97 typically is a low on-resistance power transistor that can easily sink currents resulting from an ESD discharge when transistor 97 is in a low impedance state. As long as circuit 90 is not in a normal operating state defined by output 91 greater than the reference input voltage to detector 96, transistor 14 will be enabled by the high output state of detector 96. Under normal operating states of circuit 90, transistor 14 will be disabled thereby allowing a driver control block 98 to control transistor 97.

Those skilled in the art will note that detector 96 may have a variety of implementations. One example implementation includes a comparator 94 that receives the output voltage on an inverting input and the ESD detection voltage on a non-inverting input. An output of comparator 94 is connected to input 23 of device 12.

In view of all of the above, it is evident that a novel device, method of forming the device, and method of using the device is disclosed. Included, among other features, is inhibiting the operation of a power control system by pulling the output of a startup device to a low voltage. The low voltage on the output causes the startup device to disable charging current and inhibits operation of the power control system while dissipating as low a current as possible. Also include is using one doped region to form the source and drain of a J-FET transistor and also the drain of two MOS transistors. The single doped region is formed as a closed geometric shape. Using one doped region for all three transistors minimizes the cost of the high voltage multiple output current device. The closed shape also facilitates forming the sources of the two MOS transistors adjacent to the single doped region and further minimizing the space utilized for the high voltage multiple output current device. The independently controlled MOS transistors facilitate using the high voltage multiple output current device for two different currents for sequencing the startup of the power control circuit and other circuits requiring multiple independently controlled output currents.

It should be noted that element 11 and device 12 can include more than two outputs and transistors such as transistors 14 and 15. For example, element 11 and device 12 may include a third transistor in parallel with transistors 14 and 15. The third transistor could also have a drain connected to node 16, a source that forms a third output of device 12, and a gate that forms a third input for device 12. The third transistor would have an associated third resistor having a first terminal connected to node 16 and a second terminal connected to the gate of the third transistor. The third transistor can form a third output current that is different than the first and second output currents. An example of an application using all three transistors could include transistors 14 and 15 providing the first and second output currents as explained in the description of FIG. 4, and the third transistor could provide a third output current to drive transistor 97 as explained in the description of FIG. 6. Additionally, element 11 and device 12 may have any number of such transistors and associated resistors.

What is claimed is:

1. A method of forming a high voltage multiple output current device comprising:

providing a substrate of a first conductivity type;

forming a first doped region of a second conductivity type on a first portion of the substrate including forming the first doped region as a first closed geometric shape having a center and a first periphery wherein a first portion of the first periphery has a first contour and a second portion of the first periphery has a second contour and also wherein the first doped region includes a drain and a source of a J-FET transistor, a drain of a first MOS transistor, and a drain of a second MOS transistor;

forming on the substrate a second doped region of the second conductivity type having a second periphery wherein a portion of the second periphery is juxtaposed to the first portion of the first periphery and has a third contour that is shaped the same as the first contour and wherein the second doped region is a source of the first MOS transistor; and forming on the substrate a third doped region of the second conductivity type having a third periphery wherein a portion of the third periphery is juxtaposed to the second portion of the first periphery and has a fourth contour that is shaped the same as the second contour and wherein the third doped region is a source of the second MOS transistor.

2. The method of claim 1 further including forming a gate of the first MOS transistor overlying a portion of the first portion of the first periphery and the portion of the second periphery wherein a portion of the gate of the first MOS transistor has a fifth contour that is shaped the same as the first contour, and forming a gate of the second MOS transistor overlying a portion of the second portion of the first periphery and the portion of the third periphery wherein a portion of the gate of the second MOS transistor has a sixth contour that is the same shape as the second contour.

3. The method of claim 1 wherein forming the first doped region of the second conductivity type on the first portion the substrate including forming the first doped region as the first closed geometric shape having the center and the first periphery includes forming the first doped region as a circle having a first radius from the center.

4. The method of claim 3 wherein forming on the substrate the second doped region and forming on the substrate the third doped region includes forming the second doped region as a first arc of a circle having a second radius from the center and forming the third doped region as a second arc of a circle having a third radius from the center.

5. The method of claim 1 further including forming a fourth doped region of the second conductivity type within the first doped region.

6. The method of claim 1 further including forming a first resistor having a first terminal coupled to the first doped region and a second terminal coupled to the second doped region.

7. The method of claim 1 further including forming a second resistor having a first terminal coupled to the first doped region and a second terminal coupled to the third doped region.

* * * * *